(12) United States Patent
Kwon

(10) Patent No.: US 6,462,384 B2
(45) Date of Patent: Oct. 8, 2002

(54) SEMICONDUCTOR DEVICE FOR ESD PROTECTION

(75) Inventor: Kyu-hyung Kwon, Ansan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/010,109

(22) Filed: Nov. 13, 2001

(65) Prior Publication Data

US 2002/0135032 A1 Sep. 26, 2002

(30) Foreign Application Priority Data

Mar. 23, 2001 (KR) .................................... 01-15249

(51) Int. Cl.[7] ..................... H01L 23/62; H01L 29/76; H01L 29/94; H01L 31/062; H01L 31/113
(52) U.S. Cl. ..................... 257/360; 257/365; 257/382; 257/383
(58) Field of Search ................. 257/360, 211, 257/365, 382, 383, 401

(56) References Cited

U.S. PATENT DOCUMENTS 5,898,206 A * 4/1999 Yamamoto .................. 257/360
6,037,636 A * 3/2000 Crippen ...................... 257/355
6,153,913 A * 11/2000 Hsu et al. ................... 257/355
6,376,881 B1 * 4/2002 Nagaya ....................... 257/355

* cited by examiner

Primary Examiner—Ngân V. Ngô
(74) Attorney, Agent, or Firm—Mills & Onello LLP

(57) ABSTRACT

A semiconductor device for ESD protection is provided. The semiconductor device includes a plurality of transistors having a multi-fingered structure, a plurality of multilayer interconnections separated from one another, formed in proportion to the number of common drain regions of the transistors, and connected to the common drain regions of each of the transistors; a pad conductive layer formed on the multilayer interconnections; and a plurality of contact plugs for connecting interconnections of the multilayer interconnections to one another and for connecting the multilayer interconnections to the pad conductive layer so that a current flowing in the common drain regions of the transistors may pass only through the multilayer interconnections connected to the common drain regions and may flow into the pad conductive layer. Parasitic bipolar transistors of all MOSFETs having the multi-fingered structure are turned on, thereby flowing a high current during an ESD event.

8 Claims, 8 Drawing Sheets

SEMICONDUCTOR DEVICE FOR ESD PROTECTION

BACKGROUND OF THE INVENTION

1. Field of the Invention

The present invention relates to a semiconductor device, and more particularly, to a semiconductor device for electrostatic discharge (ESD) protection.

2. Description of the Related Art

A metal oxide semiconductor field effect transistor (MOSFET) is a device which is very effective against electrostatic discharge. The MOSFET provides a discharge path for a large current between a source and a drain due to a parasitic bipolar transistor turned on during an ESD event, thereby protecting a circuit from a large external signal.

ESD protection for the MOSFET is based on a snap-back mechanism and will be described below with reference to FIGS. 1A and 1B. FIG. 1A is a sectional view of an N-channel MOSFET (NMOSFET) formed on a semiconductor substrate. If a strong electric field is generated by intersecting a drain junction 110, an avalanche breakdown is caused by the electric field in a depletion layer extended to both sides of the drain junction 110, and thus electric charges occur. Some of the electric charges flow into the drain, and remaining electric charges flow into the substrate. A local voltage for forward-biasing a source junction 120 occurs between the source and the substrate of the NMOSFET due to an accumulation of the electric charges flowing into the substrate, and when the local voltage exceeds about 0.6V, the parasitic bipolar transistor Q is turned on, thereby discharging an ESD current into a drain of the NMOSFET. Here, reference numeral R denotes substrate resistance. FIG. 1B is a graph illustrating the relationship between current and voltage for the NMOSFET during an ESD event. Here, $V_t$ and $V_{sp}$ denote a break-down voltage and a snap-back voltage (about 0.6V), respectively.

The above-mentioned NMOSFET for ESD protection may have a multi-fingered structure so as to handle a large ESD current. In particular, an NMOSFET having a long gate must be used in an input/output (I/O) interface block because of parasitic resistance, inductance, and capacitance existing in a cable for connecting a board on which a package and a chip are mounted, a chip, and an external system to one another. Moreover, an NMOSFET having the multi-fingered structure is used to realize the NMOSFET in a predetermined area more effectively.

FIG. 2A is a plan view of a conventional NMOSFET having the multi-fingered structure. A P well region 210 is formed on a semiconductor substrate (not shown), and a plurality of gate electrodes G1, G2, G3, and G4 are formed on the semiconductor substrate on which the P well region 210 is formed, and N$^+$ source regions S1, S2, and S3 and drain regions D1 and D2 are formed on right and left sides of each of the gate electrodes G1, G2, G3, and G4. A P$^+$ diffusion region 220 for supplying a bias to the P well region 210 is formed around the outside of the P well region 210. FIG. 2B is a sectional view of a semiconductor substrate 200 of FIG. 2A taken along line 2B–2B' of FIG. 2A. Parasitic bipolar transistors Q1, Q2, Q3, and Q4 operating between source regions S1, S2, and S3, drain regions D1 and D2, the P well region 210 and the P$^+$ diffusion region 220 are conceptually shown in FIG. 2B. Each source and drain of the NMOSFET functions as an emitter and a collector of the parasitic bipolar transistor, and a large current is discharged between the emitter and the collector of the parasitic bipolar transistor during an ESD event, thereby protecting an internal circuit. A reference numeral $R_{sub}$ denotes substrate resistance existing between a base and the P$^+$ diffusion region 220 of the parasitic bipolar transistor.

However, when the NMOSFETs having the multi-fingered structure are used for ESD protection, it is important that the NMOSFETs be turned on simultaneously. A reason why the MOSFETs are not turned on simultaneously in these prior art devices will be described with reference to FIG. 3. FIG. 3 partially illustrates the NMOSFET of FIG. 2B and the parasitic bipolar transistor of the NMOSFET. As shown in FIG. 3, since distances from the P$^{30}$ diffusion region 220 to the parasitic bipolar transistors Q1 and Q2 are different, substrate resistance, that is, values of base resistors R1 and R2, are different. As a result, the local voltage, which occurs on the source junction of each NMOSFET due to accumulation of the electric charges after the avalanche break down, changes. Thus, the time required for each of the parasitic bipolar transistors to reach the snap-back voltage is different, and thus the parasitic bipolar transistors are turned on at different times. In FIG. 3, the parasitic bipolar transistor Q2 having large base resistance is turned on faster than the parasitic bipolar transistor Q1.

Non-simultaneous turn-ons of the NMOSFETs having the multi-fingered structure causes serious problems for the discharge characteristics of the NMOSFET having a silicide layer, which is formed on the source and drain regions of each transistor so as to guarantee high-speed operation of the transistor by increasing a saturation current of the transistor and by reducing the parasitic resistance and capacitance. This will be described with reference to FIG. 4A. FIG. 4A is a sectional view of a transistor having the multi-fingered structure formed on a semiconductor substrate 300. A silicide layer 340 is formed on a gate electrode 310 on a gate oxide layer 370 and on source and drain regions 320 and 330 of the transistor by a selfaligned silicide (SALICIDE) process. In view of ESD, resistance of the parasitic bipolar transistor is reduced by the suicide layer 340 during an ESD event after snapback. This is referred to as "on" resistance $R_{on}$ and denotes the inverse number of the slope of a current-voltage graph after reaching a snap-back voltage $V_{sp}$ in the current-voltage graph of FIG.1 B. A discharged current is increased by reducing the "on" resistance, and electric charges accumulate on source and drain junctions (region marked by a dotted line) adjacent to the silicide layer 340 around sidewalls 350 of the gate electrode 310, thereby resulting in high current density in the source and drain junctions. As mentioned previously, the NMOSFETs having relatively high base resistance for NMOSFETs having the multi-fingered structure are turned on faster than other NMOSFETs, and a predetermined interval of time is necessary to turn on the neighboring NMOSFETs. However, the source and drain junctions are destroyed because of the high current density caused by the silicide layer, and thus it is difficult to allow for the predetermined interval of time to turn on the NMOSFETs. As a result, only some NMOSFETs are discharged, and thus benefits to using NMOSFETs having the multi-fingered structure are negated.

As one method for solving these problems, a suicide layer 340' of source and drain regions 320 and 330 is formed at a predetermined interval $W_1$ from gate electrode sidewalls 350, thereby dispersing the current density of the junction, as shown in FIG. 4B. However, the method has other problems. First, a separate mask (not shown) is required to the source and drain regions 320 and 330 regions for selective formation of the silicide layer, thus complicating the process. Second, it is difficult to perform a high-speed operation due to an increase in parasitic resistance of the source and drain regions 320 and 330. Also, in a case where the SALICIDE process for the source and drain regions 320 and 330 is performed simultaneously with the SALICIDE process of the gate electrode 340, it is difficult to obtain a process margin for formation of the mask (not shown).

Meanwhile, as another method for solving these problems, a discharge area can be increased by increasing the area of source and drain junctions 380, as shown in FIG. 4C. However, in this method, performance of the transistor due to the increase in parasitic resistance deteriorates, and there are limitations to an increase in the discharge area, and thus the change in ESD characteristics is small. As described above, unexplained reference numerals in FIGS. 4B and 4C denote the same elements as those in FIG. 4A, and the descriptions thereof will be omitted.

SUMMARY OF THE INVENTION

To solve the above problems, it is an objective of the present invention to provide a semiconductor device for ESD protection capable of improving discharge efficiency by increasing "on" resistance of a MOSFET having a multi-fingered structure.

Accordingly, there is provided in accordance with the invention a semiconductor device for ESD protection. The semiconductor device for ESD protection includes a plurality of transistors having a multi-fingered structure, a plurality of multilayer interconnections separated from one another, formed in proportion to the number of common drain regions of the transistors, and connected to the common drain regions of each of the transistors, a pad conductive layer formed on the multilayer interconnections, and a plurality of contact plugs for connecting interconnections of the multilayer interconnections to one another and for connecting the multilayer interconnections to the pad conductive layer so that a current flowing the common drain regions of the transistors may pass only through the multilayer interconnections connected to the common drain regions and may flow into the pad conductive layer.

In one embodiment, the multilayer interconnections are formed of Al, Cu, or an alloy of Al and Cu, and the pad conductive layer is formed of Al, Cu, or an alloy of Al and Cu.

It is preferable that the gate electrodes and source/drain regions of the transistors include silicide formed by a self-aligned silicide (SALICIDE) process, and the silicide is one of cobalt silicide and tungsten silicide.

It is preferable that the number of the multilayer interconnections is the same as the number of common drain regions of the transistors having the multi-fingered structure.

According to an embodiment of the present invention, interconnections of each layer forming the multilayer interconnections may have a stripe pattern. Also, according to another embodiment of the present invention, the multilayer interconnections may include sequentially stacked first and second interconnection layers comprising interconnections that are isolated island-shaped patterns in each layer forming the multilayer interconnections, and the first and second interconnection layers may be connected to the plurality of contact plugs so that current flowing the interconnections may pass through the plurality of isolated islandshaped patterns of the first and second interconnection layers and may flow into the pad conductive layer.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Embodiment 1

Figure 1A:
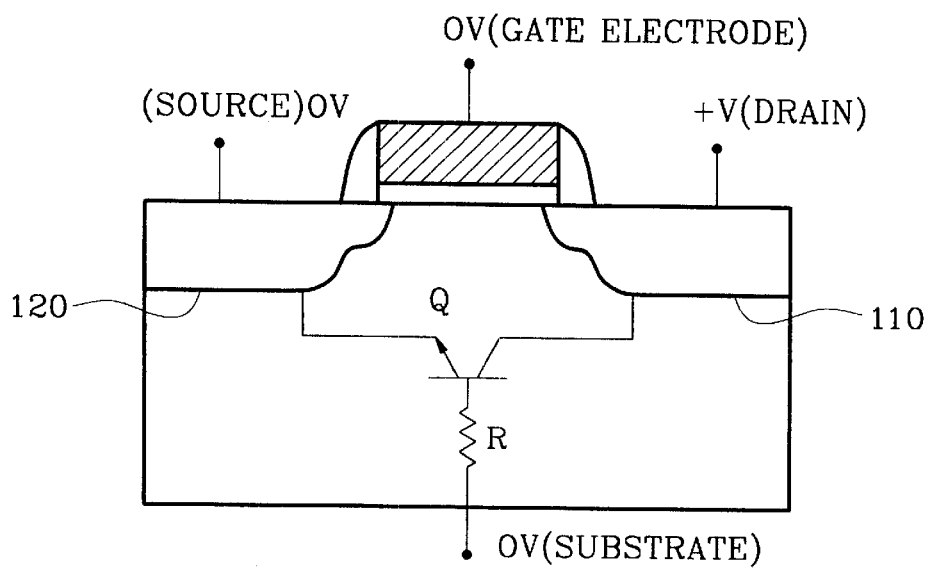
FIG. 1A is a sectional view of a conventional N-channel MOSFET (NMOSFET) illustrating a snap-back mechanism occurring during an ESD event.
Figure 1B:
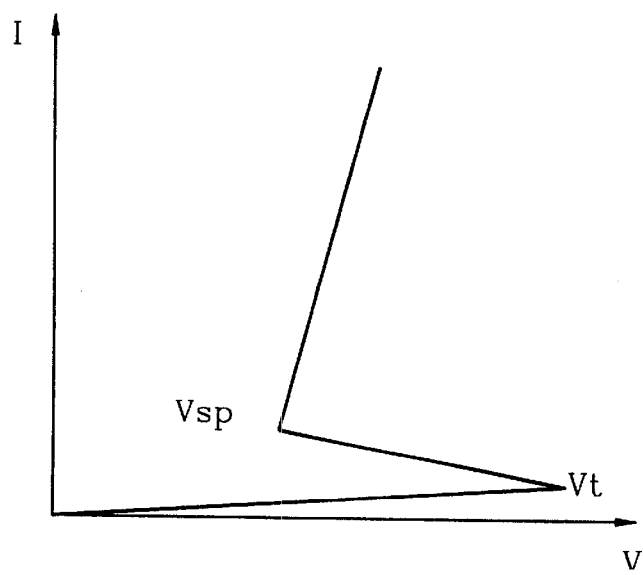
FIG. 1B is a graph illustrating the relationship between current and voltage for the NMOSFET of FIG. 1A during an ESD event.
Figure 2A:
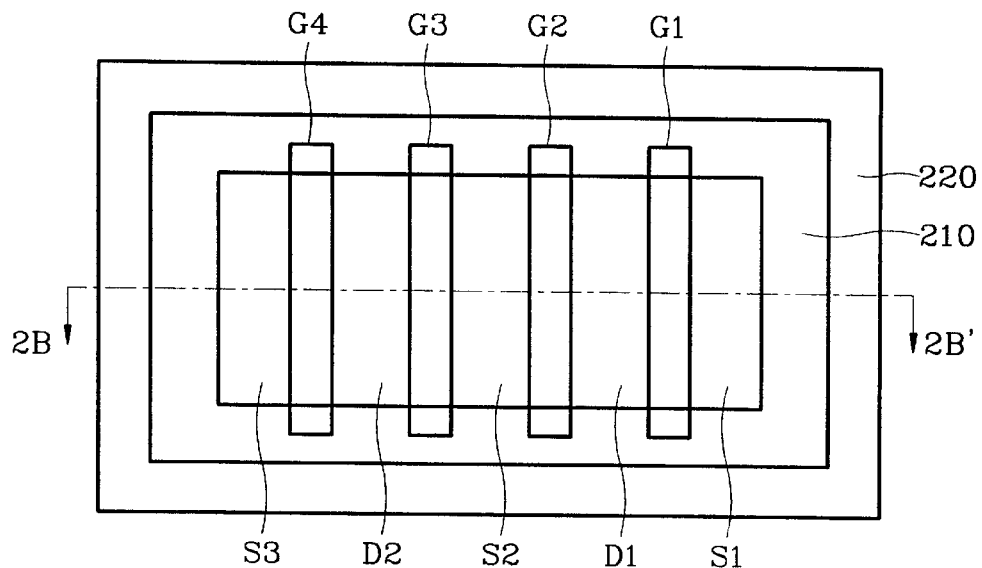
FIG. 2A is a plan view of a conventional NMOSFET having the multi-fingered structure.
Figure 2B:
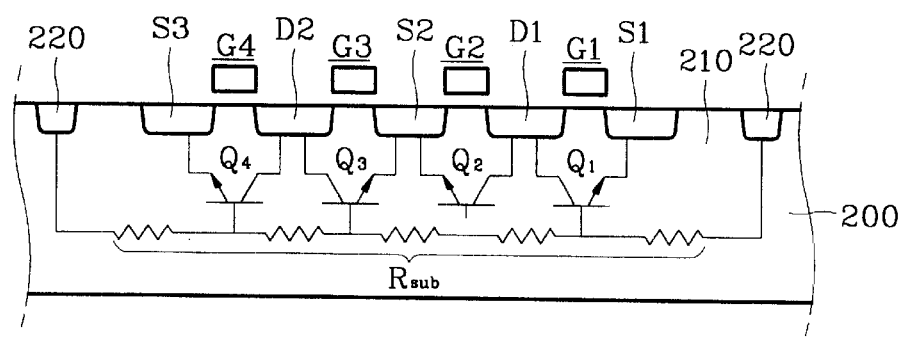
FIG. 2B is a sectional view of the NMOSFET of FIG. 2A taken along line 2B–2B' of FIG. 2A.
Figure 3:
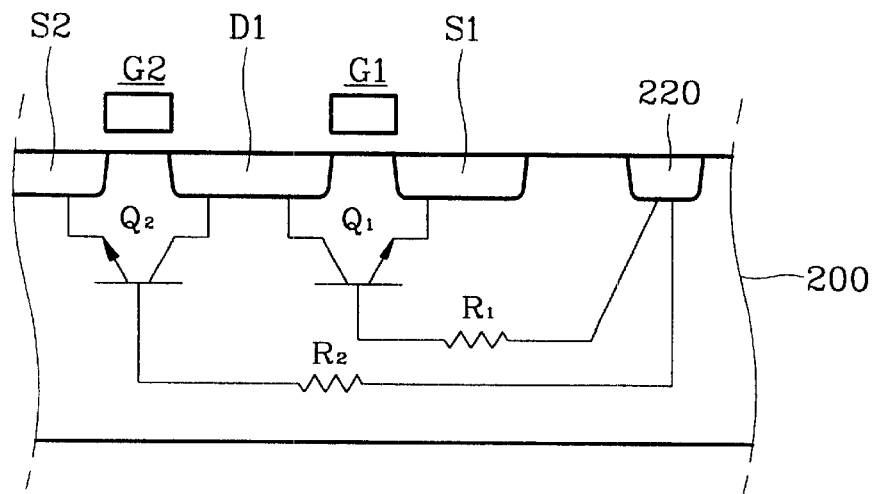
FIG. 3 partially illustrates each NMOSFET of FIG. 2B and the parasitic bipolar transistor of each NMOSFET.
Figure 4A:
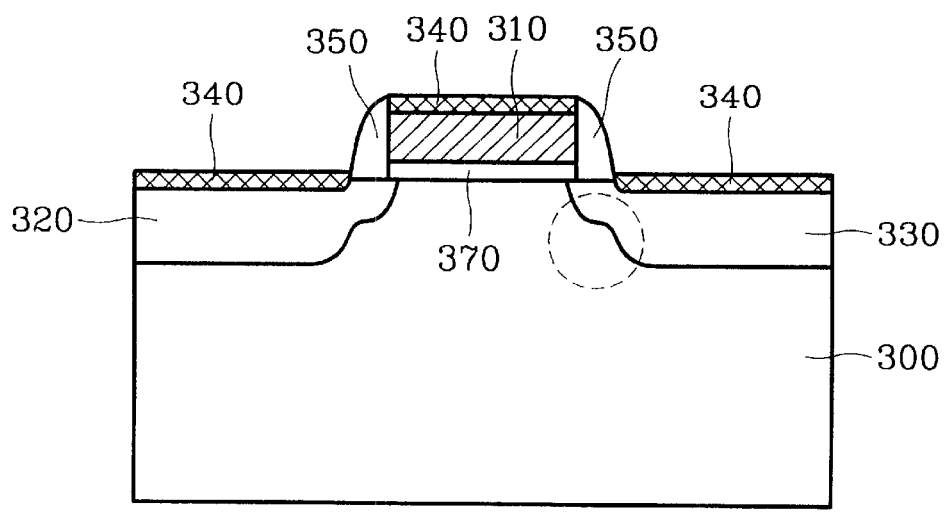
FIG. 4A is a sectional view of the conventional MOSFET in which a silicide layer is formed on gate electrodes and source and drain regions by a self-aligned silicide (SALICIDE) process.
Figure 4B:
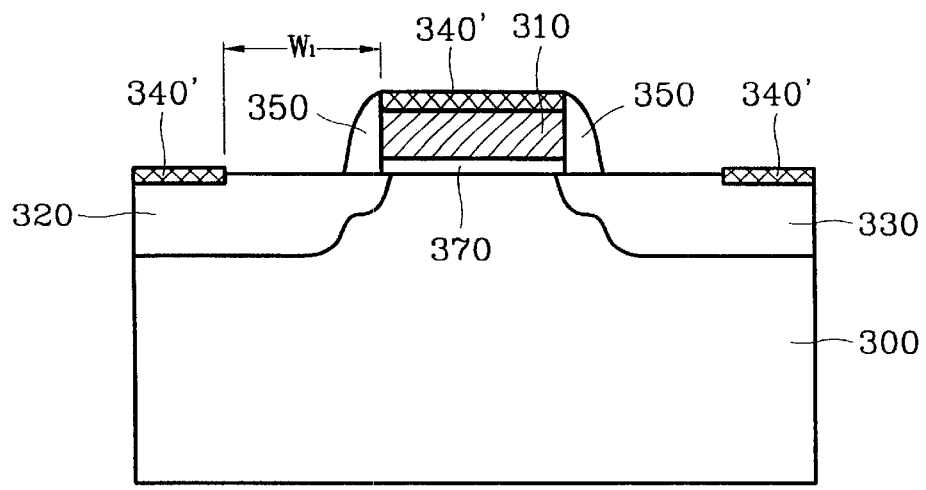
FIGS. 4B and 4C are sectional views of improved MOSFETs for improving ESD protection according to the prior art.
Figure 4C:
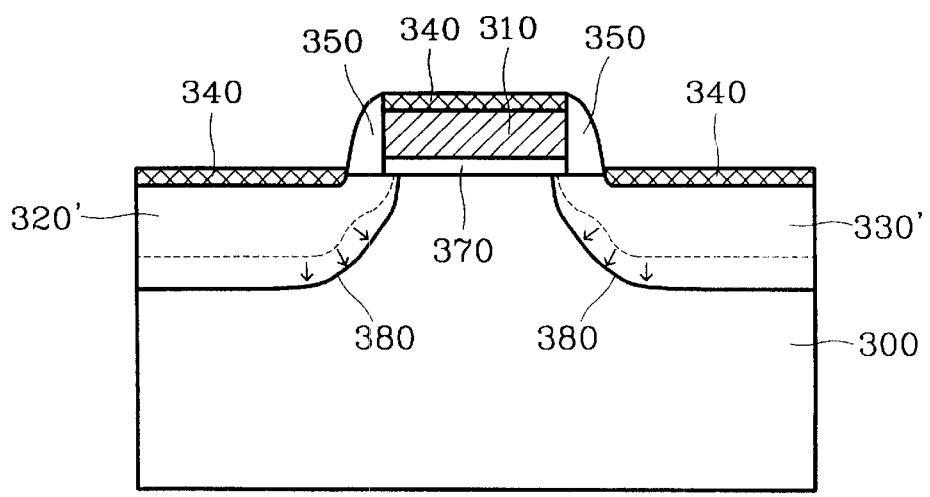
Figure 5A:
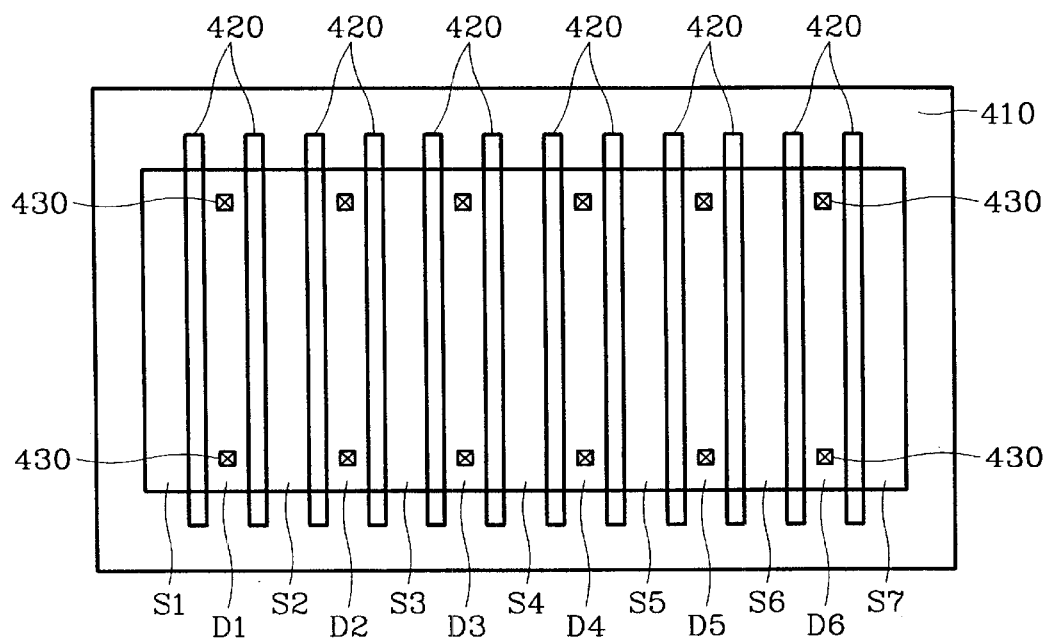
FIGS. 5A and 5B illustrate MOSFETs having the multi-fingered structure and a bonding pad structure according to a first embodiment of the present invention.
Figure 5B:
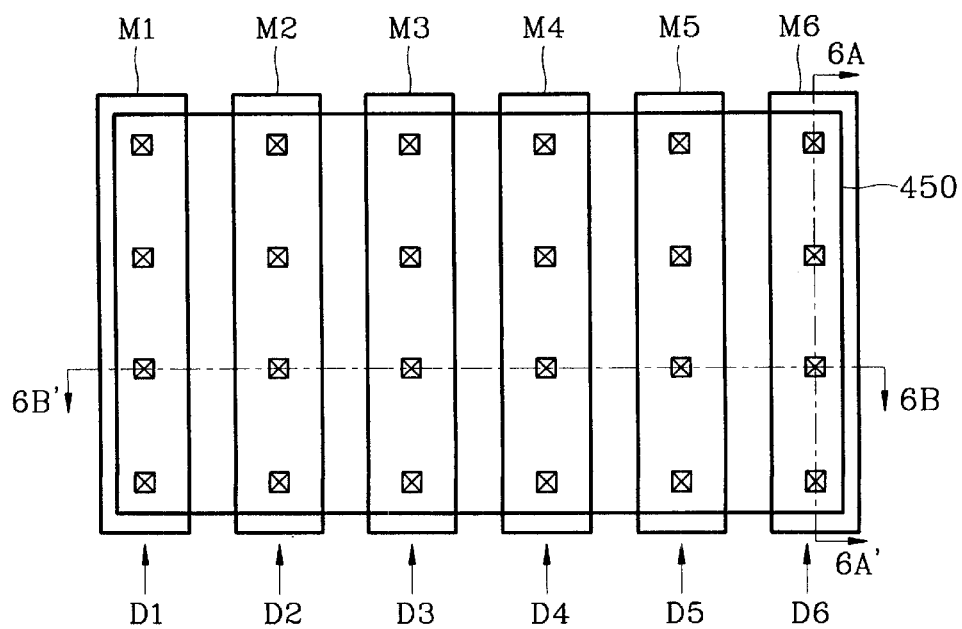

FIGS. 5A and 5B illustrate MOSFETs having a multi-fingered structure used in a semiconductor device for ESD protection of the present invention and bonding pad structures connected to the MOSFETs. Referring to FIG. 5A, an NMOSFET used as an ESD protection circuit is comprised of a plurality of transistors having the multi-fingered structure. A P well region 410 is formed on a semiconductor substrate, and a plurality of gate electrodes 420 are formed on the semiconductor substrate in which the P well region 410 is formed. N$^+$ source regions S1, S2, . . . , S7 and drain regions D1, D2, . . . , D6 are formed in right and left sides of each of the gate electrodes. A P$^+$ diffusion region (not shown) for supplying a bias to the P well region 410 is formed in the outside of the P well region 410. An interlevel dielectric (ILD) film (not shown) is formed on the transistors, and metal interconnection layers (not shown) for connecting the NMOSFET to the bonding pad structure are formed on the ILD film on the drain regions D1, D2, . . . , D6. The metal interconnection layers and each of the drain regions of the NMOSFET are connected via contact plugs 430. The number of transistors and metal interconnection layers can be properly determined according to the objective of the present invention.

Referring to FIG. 5B, the bonding pad structure of the present invention includes a plurality of multilayer interconnections M1, M2, . . . , M6, and a pad conductive layer 450 formed on the multilayer interconnections M1, M2, ..., M6. Each of the multilayer interconnections M1, M2, ..., M6 is connected to the drain regions D1, D2, ..., D6 of the transistors having the multi-fingered structure of FIG. 5A and transmits an electrical signal from the drain regions D1, D2, ..., D6 to the pad conductive layer 450. In the embodiment, although the same number of multilayer interconnections as drain regions of the MOSFET are formed, the number of multilayer interconnections is not restricted to this. For example, more than two drain regions may be connected to one multilayer interconnection.

The multilayer interconnections M1, M2, ..., M6 are comprised of a plurality of interconnection layers, and the number of layers of the multilayer interconnections may be arbitrarily determined, or may be determined by the number of interconnection layers formed around the bonding pad structure. In one embodiment, the multilayer interconnections are formed of three interconnection layers.

With regard to the multilayer interconnections formed of three interconnection layers, the bonding pad structure of FIG. 5B will be described in detail with reference to FIGS. 6A and 6B.

Figure 6A:
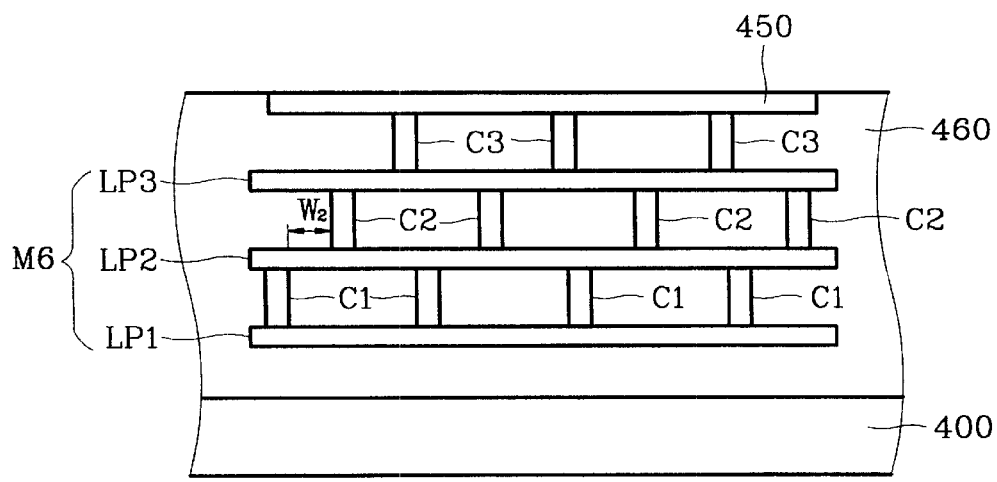
FIGS. 6A and 6B are sectional views of the bonding pad structure of FIG. 5B taken along lines 6A–6A' and 6B–6B', respectively, of FIG. 5B.
Figure 6B:
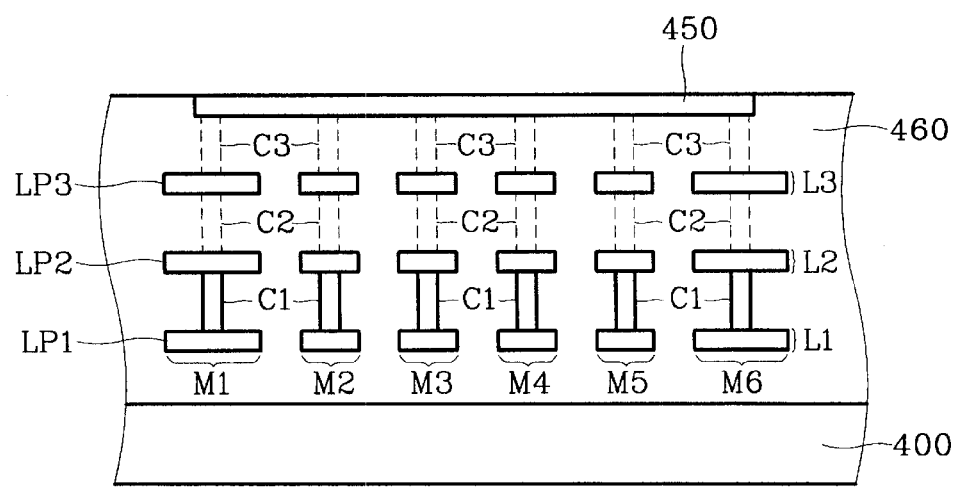

FIG. 6A is a sectional view of the bonding pad structure of FIG. 5B taken along lines 6A–6A' and is a longitudinal sectional view of multilayer interconnection M6 connected to a drain region D6 of the NMOSFET having the multi-fingered structure. FIG. 6B is a sectional view of the bonding pad structure of FIG. 5B taken along lines 6B–6B' and is a cross-sectional view of the multilayer interconnections.

A $SiO_2$-based oxide layer in which a chemical vapor deposition (CVD) process is performed, or an interlevel dielectric (ILD) film 460 such as a $SiO_2$-based glass layer formed by a spin on glass (SOG) method, is formed on a semiconductor substrate 400. A first interconnection layer L1 is formed in the ILD film 460. Interconnection patterns LP1 of the first interconnection layer L1 are each comprised of a separated stripe-shaped interconnection pattern. The first interconnection layer L1 is connected to the drain regions D1, D2, ..., D6 of the NMOSFET having the multi-fingered structure of FIG. 5A. A second interconnection layer L2 and a third interconnection layer L3, which have the same patterns as the interconnection patterns LP1 of the first interconnection layer L1, are sequentially formed on the first interconnection layer L1. The first, second, and third interconnection layers L1, L2, and L3 are separated by the ILD film 460. Each of the interconnection layers L1, L2, and L3 may be formed of Al, Cu, or an alloy of Al and Cu. The first, second, and third interconnection layers L1, L2, and L3 are connected by contact plugs C1, C2, and C3 formed passing through the ILD film 460 and interposed among the first, second, and third interconnection layers L1, L2, and L3. That is, a first contact plug C1 is formed between the first interconnection layer L1 and the second interconnection layer L2, and a second contact plug C2 is formed between the second interconnection layer L2 and the third interconnection layer L3. A pad contact plug C3 is formed between the third interconnection layer L3 and the pad conductive layer 450. The interconnection patterns of each of the interconnection layers L1, L2, and L3 are only vertically connected, and the interconnection patterns on the same layer are electrically separated from one another.

The contact plugs C1, C2, and C3 for connecting the interconnection layers L1, L2, and L3 may be formed of a proper number for each layer. That is, the proper number of the contact plugs C1, C2, and C3 may be formed so that "on" resistance may be maintained within a proper range such that the MOSFET is not destroyed when it is first turned on. This is achieved by controlling the resistance of the interconnection patterns LP1, LP2, and LP3 on each layer connected to the drain regions D1, D2, ..., D6 of FIG. 5B of the MOSFET and by controlling the resistance of the first and second contract plugs C1 and C2, and the pad contact plug C3.

The contact plugs C1, C2, and C3 may be crossed to obtain a resistance path in each interconnection layer. For example, the first contact plug C1 and the second contact plug C2 may be formed so that the second interconnection layer L2 may be used as the resistance path by obtaining a predetermined interval $W_2$ when the first contact plug C1 and the second contact plug C2 are projected onto the semiconductor substrate.

In the semiconductor device for ESD protection of the present invention, the multilayer interconnections M1, M2, ..., M6 under the pad conductive layer 450 are separated from one another. In the above structure, "on" resistance of the parasitic bipolar transistor is increased so that the multilayer interconnections M1, M2, ..., M6 and the contact plugs C1, C2, and C3 for connecting the multilayer interconnections M1, M2, ..., M6 may function as resistance by flowing current, which is discharged when the parasitic bipolar transistor of the MOSFET having the multi-fingered structure is turned on during an ESD event, into the drain regions of the MOSFET. Thus, even if the parasitic bipolar transistor of an MOSFET having the multi-fingered structure is not turned on simultaneously, a large current can still be flowed by turning on the parasitic bipolar transistor of all MOSFETs having the multi-fingered structure such that a time interval for turning on neighboring MOSFETs may be obtained by increasing "on" resistance of the MOSFET first turned on.

Since each of the multilayer interconnections in the embodiment is connected in parallel to the pad conductive layer, as the number of the multilayer interconnections increases, the total resistance, including the resistance of the multilayer interconnections and the resistance of the pad conductive layer, decreases. Thus, after an initial turn-on, as the number of parasitic bipolar transistors that is turned on increases, the total "on" resistance is reduced, thereby allowing a large current to flow.

Embodiment 2

Figure 7A:
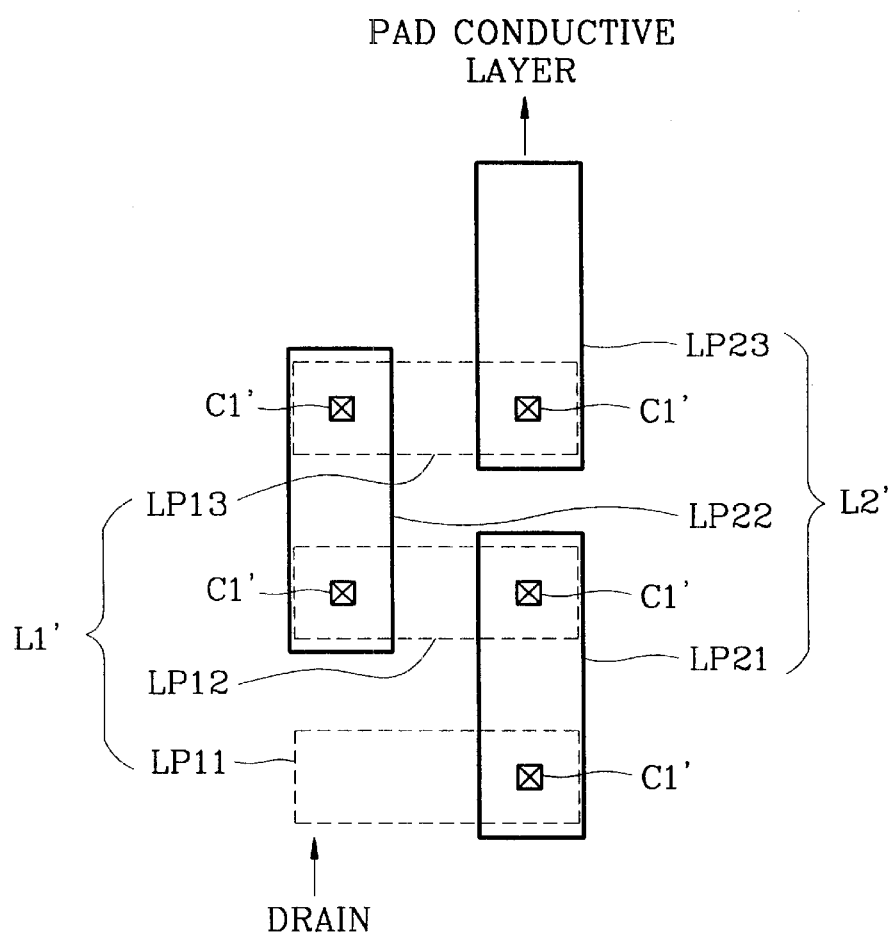
FIGS. 7A and 7B illustrate an example of multilayer interconnections applied to the bonding pad structure according to a second embodiment of the present invention.
Figure 7B:
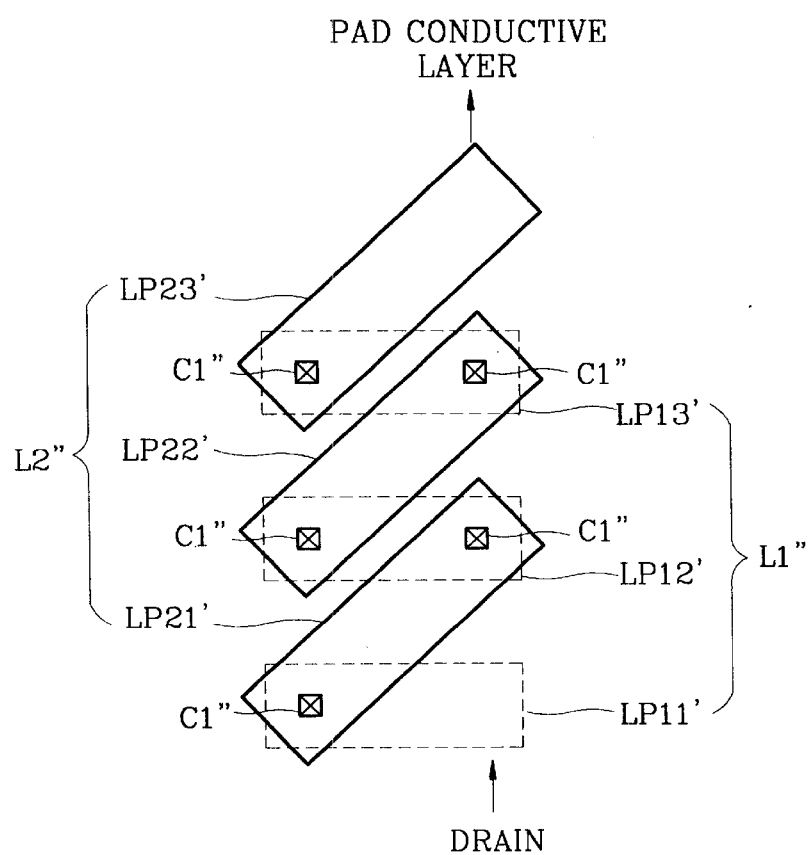

FIGS. 7A and 7B are plan views illustrating two-layer interconnection patterns for forming the multilayer interconnections of the present invention. Referring to FIG. 7A, a first interconnection layer L1' is formed in an interlevel dielectric (ILD) film (not shown) on the semiconductor substrate (not shown). The first interconnection layer L1' is composed of isolated island-shaped interconnection patterns LP11, LP12, and LP13 which are arranged parallel with their ends aligned. A second interconnection layer L2' is formed on the first interconnection layer L1'. Interconnection patterns LP21, LP22, and LP23 of the second interconnection layer L2' are each comprised of an isolated island-shaped interconnection pattern, which is formed to connect with one end of two neighboring patterns (for example, interconnection patterns LP11 and LP12) of the first interconnection layer L1'. Contact plugs C1' are formed on portions where the interconnection patterns LP11, LP12, and LP13 of the first interconnection layer L1' connect with the interconnection patterns LP21, LP22, and LP23 of the second interconnection layer L2'. Electrical signals received from the drain regions of the MOSFET and transmitted to the interconnection patterns LP11, LP12, and LP13 of the first interconnection layer L1' flow into the pad conductive layer via a path through LP11→LP21→LP12→LP22→LP13→LP23 in that order. That is, the interconnection layers L1' and L2' can be designed so that the electrical signals may pass through the interconnection patterns of the first interconnection layer L1' and the interconnection patterns LP21, LP22, and LP23 of the second interconnection layer L2'. The number of the interconnection patterns in the first and second interconnection layers L1' and L2' can be properly determined in regard to the "on" resistance of the parasitic bipolar transistor of the MOSFET. Also, since resistance can be obtained by the interconnection layers having the above structure, it becomes easy to form more than two drain regions of the MOSFET having the multi-fingered structure electrically connected to the multilayer interconnections.

FIG. 7B illustrates another method for arranging the interconnection patterns of the interconnection layers in the similar way to FIG. 7A. As shown in FIG. 7B, interconnection patterns LP21', LP22', and LP23' of a second interconnection layer L2'' diagonally connect to both ends of interconnection patterns LP11', LP12', and LP13' of a first interconnection layer L1'' via contact plugs C1''.

A resistance larger than that for the separated stripe-shaped interconnection pattern can be obtained by the arrangement of the above-mentioned patterns. Thus, the method can be applied to increase "on" resistance in a case where the number of the interconnection layers of the multilayer interconnections is definite, for example, in a case where the interconnection layers having more than two layers cannot be used.

According to the present invention, due to the bonding pad structure having multilayer interconnections that are separated from one another, the contact plugs for connecting the interconnection layers and the multilayer interconnections function as resistance, thereby increasing the "on" resistance of the parasitic bipolar transistor. Thus, a large current can be obtained by turning on the parasitic bipolar transistor of all MOSFETs having the multi-fingered structure such that a time interval for turning on neighboring MOSFETs may be obtained by increasing "on" resistance of the MOSFET firstly turned on.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A semiconductor device for ESD protection comprising:
   a plurality of transistors having a multi-fingered structure;
   a plurality of multilayer interconnections separated from one another, formed in proportion to a number of common drain regions of the transistors, and connected to the common drain regions of each of the transistors;
   a pad conductive layer formed on the multilayer interconnections; and
   a plurality of contact plugs for connecting interconnections of the multilayer interconnections to one another and for connecting the multilayer interconnections to the pad conductive layer so that a current flowing in the common drain regions of the transistors may pass only through the multilayer interconnections connected to the common drain regions and may flow into the pad conductive layer.

2. The semiconductor device for ESD protection of claim 1, wherein interconnections of each layer forming the multilayer interconnections have a stripe pattern.

3. The semiconductor device for ESD protection of claim 1, wherein the multilayer interconnections include sequentially stacked first and second interconnection layers comprising interconnections that are isolated island-shaped patterns in each layer forming the multilayer interconnections, and the first and second interconnection layers are connected to the plurality of contact plugs so that current flowing the interconnections may pass through the plurality of isolated islandshaped patterns of the first and second interconnection layers and may flow into the pad conductive layer.

4. The semiconductor device for ESD protection of claim 1, wherein the multilayer interconnections are formed of one of Al, Cu, and an alloy of Al and Cu.

5. The semiconductor device for ESD protection of claim 1, wherein the pad conductive layer is formed of one of Al, Cu, and an alloy of Al and Cu.

6. The semiconductor device for ESD protection of claim 1, wherein the number of the multilayer interconnections is the same as the number of common drain regions of the transistors having the multi-fingered structure.

7. The semicomductor device for ESD protection of claim 1, wherein gate electrodes and source/drain regions of the transistors include silicide formed by a self-aligned silicide (SALICIDE) proses.

8. The semiconductor device for ESD protection of claim 7, wherein the silicide is one of cobalt silicide and tungsten silicide.

* * * * *